(12) United States Patent
Morita

(10) Patent No.: US 6,277,531 B1
(45) Date of Patent: Aug. 21, 2001

(54) CHARGED-PARTICLE-BEAM MICROLITHOGRAPHY APPARATUS AND METHODS INCLUDING FOCAL-POINT CORRECTION

(75) Inventor: Kenji Morita, Kawagoe (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/417,965

(22) Filed: Oct. 13, 1999

(30) Foreign Application Priority Data

Oct. 14, 1998 (JP) ................................................ 10-306399

(51) Int. Cl.$^7$ ................................ G03F 9/00; G03C 5/00

(52) U.S. Cl. ......................... 430/30; 430/296; 250/492.2; 250/492.3

(58) Field of Search .................. 430/30, 296; 250/492.2, 250/492.3

(56) References Cited

PUBLICATIONS

Farrow et al., "Mark Detection for Alignment and Registration in a High–Throughput Projection Electron Lithography Tool," *J. Vac. Sci. Technol.* 10:2780–2783 (1992).

*Primary Examiner*—Christopher G. Young
(74) *Attorney, Agent, or Firm*—Klarquist Sparkman Campbell Leigh & Whinston, LLP

(57) ABSTRACT

Apparatus and methods are disclosed for performing microlithography of a pattern defined by a reticle that is divided (segmented) into multiple exposure units. During exposure of each exposure unit, appropriate focal-point corrections are made according to variations in feature density and feature distribution within individual exposure units. Each exposure unit is divided into multiple subregions. The proportion of the area of each subregion occupied by actual pattern features is determined. A mean (average) feature density in the exposure unit is calculated based on the minimum (not zero) surface area of features and the maximum surface area of features. Based on the result of such a calculation, the focal point for the exposure unit is adjusted as required using a focal-point correction lens.

6 Claims, 5 Drawing Sheets

Calibration Curve $S_M = (S_A + S_B)/2$

CHARGED-PARTICLE-BEAM MICROLITHOGRAPHY APPARATUS AND METHODS INCLUDING FOCAL-POINT CORRECTION

FIELD OF THE INVENTION

This invention pertains to microlithography apparatus and methods as used, for example, in the manufacture of integrated circuits, displays, and the like. More specifically, the invention pertains to such microlithography apparatus and methods that employ a charged particle beam such as an electron beam or ion beam to transfer and expose a pattern, defined by a reticle, onto a "sensitized" surface (i.e., surface to be imprinted with the pattern) such as a surface of a semiconductor wafer coated with a resist.

BACKGROUND OF THE INVENTION

Known relevant prior art is summarized below with reference to microlithography apparatus that employ an electron beam as a representative charged particle beam for performing projection transfer of a pattern defined by a reticle.

Projection-exposure microlithography using an electron beam exhibits high accuracy but low "throughput" (i.e., number of wafers that can be processed per unit time). Various technical approaches have been considered for solving this problem. One current approach is termed "cell projection" which is predominantly used whenever the pattern to be transferred comprises a relatively large area in which a particular small portion of the pattern is repeated many times (such as in a pattern for a memory chip comprising a large number of identical memory cells wherein each memory cell represents the repeated small portion). The highly repeated portion of the pattern is represented by a cell (approximately $(5 \,\mu m)^2$ on the wafer) that is exposed multiple times on different respective regions of the wafer. Unfortunately, however, portions of the pattern that are not in the highly repeated region must be transferred using another technique such variable-shaped-beam writing. The need to change exposure methods to achieve exposure of the entire pattern and the inherent slowness of beam writing result in cell projection having, usually, an unacceptably low throughput.

Another conventional approach that has been considered offers much greater throughput. In this technique, the reticle defines the entire pattern to be projected onto a die region on the wafer in one exposure or "shot" of the electron beam. The transferred image is typically "demagnified" or "reduced" by which is meant that the image formed on the wafer is smaller than the corresponding pattern on the reticle by a "demagnification factor." The demagnification factor is usually an integral ratio such as ¼ or ⅕. Unfortunately, exposing an entire die pattern in one shot cannot be performed with sufficient accuracy, mainly because the charged-particle-beam optics must be very large to accommodate a field the size of an entire die. Such large optics exhibit excessive aberrations, especially along the edges of the exposure field. Furthermore, producing a reticle for such exposure is extremely difficult.

Yet another conventional approach involves dividing the reticle pattern into multiple "exposure units" (pattern portions such as "subfields"). Such a reticle is termed a "divided" or "segmented" reticle. The exposure units are exposed individually in an ordered manner using a projection-optical system having a relatively large optical field (but still much smaller than would be required for single-shot exposure of an entire die pattern). Such a technique is termed "divided-pattern" projection-transfer. As each exposure unit is projected onto the wafer, aberrations exhibited by the projection-optical system (e.g., distortion and shifts in the focal point) are corrected. Hence, divided-pattern projection-transfer offers prospects of high resolution and transfer accuracy over the entire pattern as transferred to the wafer, compared to single-shot transfer of an entire die pattern.

On a "divided" reticle, the pattern is divided into multiple exposure units typically having a uniformly fixed area (e.g., sized to produce corresponding exposure regions measuring $(250 \,\mu m)^2$ on the wafer). Each exposure unit on the reticle is typically separated from adjacent exposure units by "struts" (reinforcing crosspieces) flanked by "skirts" (non-patterned regions). The struts provide structural rigidity to the reticle.

Normally, most if not all the exposure units of a pattern to be exposed are different from each other and have different arrangements or distributions of pattern features and/or different "feature densities." Such differences from one exposure unit to another, and from one subregion to another subregion within the same exposure unit, can cause a corresponding substantial change in beam current passing through the exposure unit or subregion of an exposure unit to the wafer. I.e., even with a constant beam current illuminating the exposure units on the reticle, the beam current actually passing through an exposure unit, or through different subregions of a single exposure unit, can vary substantially from one exposure unit to the next or from one subregion of an exposure unit to another. Accompanying such changes in beam current usually are changes in Coulomb interactions (Coulomb effects) among the electrons in the beam propagating from the reticle to the wafer. Generally, the higher the localized beam current, the greater the corresponding localized Coulomb effect. A change in the magnitude of the Coulomb effect is manifest as a corresponding change in focus of the image on the wafer, such as from one exposure unit to the next or from one region to the next within a single exposure unit.

Focal shifts, especially those occurring from one exposure unit to the next, can be corrected to some extent by making compensating adjustments of current or voltage applied to a lens through which the beam passes. However, Coulomb effects arising from variations in feature density or feature distribution within individual exposure units are difficult to correct in this manner. I.e., an ideal focus setting for a particular exposure unit may not achieve ideal focus for all the features defined in the exposure unit because the ideal focus for one feature may not be ideal for another feature in the exposure unit. Hence, an ideal focus condition normally is achieved only for a small region within each exposure unit, and conventional efforts to improve this situation for other regions of each exposure unit using a focusing lens typically results in a deterioration of overall exposure accuracy of the exposure unit.

Conventional methods directed at reducing the magnitude of focus shift due to Coulomb effects include reducing the beam current used to illuminate each exposure unit of the reticle and reducing the size of each exposure unit. Unfortunately, however, both methods reduce throughput, making them impractical for industrial use.

SUMMARY OF THE INVENTION

The present invention takes the above-mentioned problems into consideration and has an objective of providing what is called a divided-pattern transfer-exposure method, using an electron beam, that allows appropriate focal-point corrections when there are deviations in the pattern distribution within a small region.

According to one aspect of the invention, methods are provided in which a pattern, defined by a divided (or "segmented") reticle, is projection-transferred exposure unit by exposure unit to the wafer. The images of the exposure units are formed on the wafer in locations in which the images are stitched together to form the entire pattern. To ensure that the image of each exposure unit is at a desired focus, the imaging beam passes through a focal-point-correction lens situated in the projection-optical system. Multiple exposure units are divided into subregions, and the feature surface area in each subregion is determined. A mean value is calculated from the minimum (excluding zero) feature surface area and the maximum feature surface area. The focal point for a particular exposure unit is adjusted as required (in accordance with the mean value) by changing the electrical energy applied to the focal-point correction lens.

According to another aspect of the invention, charged-particle-beam microlithographic exposure apparatus are provided for performing projection transfer of a pattern, defined by a divided (segmented) reticle to a substrate such as a wafer. The reticle is divided into exposure units that are individually projection-transferred. An image of each exposure unit is formed on the substrate in a respective location such that the images of all the exposure units are properly stitched together on the substrate to form the entire pattern. The apparatus comprises a projection-optical system that includes a projection lens and a focal-point correction lens. The focal-point correction lens corrects the image-forming conditions as the image of each exposure unit is being transferred. To determine the amount of correction required, a reference mark is disposed on the reticle stage. The reference mark is used for calibrating the feature surface area within each of multiple subregions of an exposure unit, to allow determination of a corresponding amount of focal-point correction. The reference mark forms an image on a surface to be exposed so as to allow calibration of the amount of focal-point correction.

If the distribution of features within an exposure unit is not uniform, the focus correction required for a subregion of the exposure unit having the lowest feature density (but not zero) will be different from the focus correction required for a subregion of the exposure unit having the highest feature density. If such an exposure unit were projected without focus correction, then localized image blurring would be evident. Hence, the exposure unit is divided into multiple subregions and a mean amount of focus correction is determined from the feature surface areas within each subregion. The variation in feature size in the exposure unit is controlled as much as possible by exposing the exposure unit using the mean value of focus correction for that exposure unit.

Obtaining the total feature area within an exposure unit and determining the amount of focus correction for the particular feature area without dividing the exposure unit into subregions has been considered. However, the present invention goes beyond that. An object of the invention is to render image blurring at both the densest feature density and the sparsest feature density in an exposure unit within an acceptable range. If a mean feature distribution within an exposure unit is obtained and the focus-correction amount determined from that value, then the amount of focus correction will tend to move toward the sparsest subregion and feature blurring in the densest subregion will be excessive (e.g., whenever the sparsest portion of the feature distribution occupies almost the entire exposure unit and the densest portion just a small portion of the exposure unit.) From the viewpoint of reducing image blurring at the worst locations in each exposure unit, methods according to the invention achieve excellent results.

The feature surface area referred to herein is the surface area of the portion of the exposure unit through which the charged particle beam passes without any comparative absorption or scattering (i.e., in a membrane or scattering reticle, the membrane portion lacking a scattering body; an aperture in the membrane of a stencil reticle).

Methods and apparatus according to the invention are applicable to both step-and-repeat systems and continuous scanning systems as used to expose a pattern exposure unit by exposure unit.

The foregoing and additional features and advantages of the invention will be more apparent from the following detailed description, which proceeds with reference to the accompanying drawings.

DETAILED DESCRIPTION

A representative embodiment of an apparatus according to the invention is described with reference to the drawings.

Figure 3:
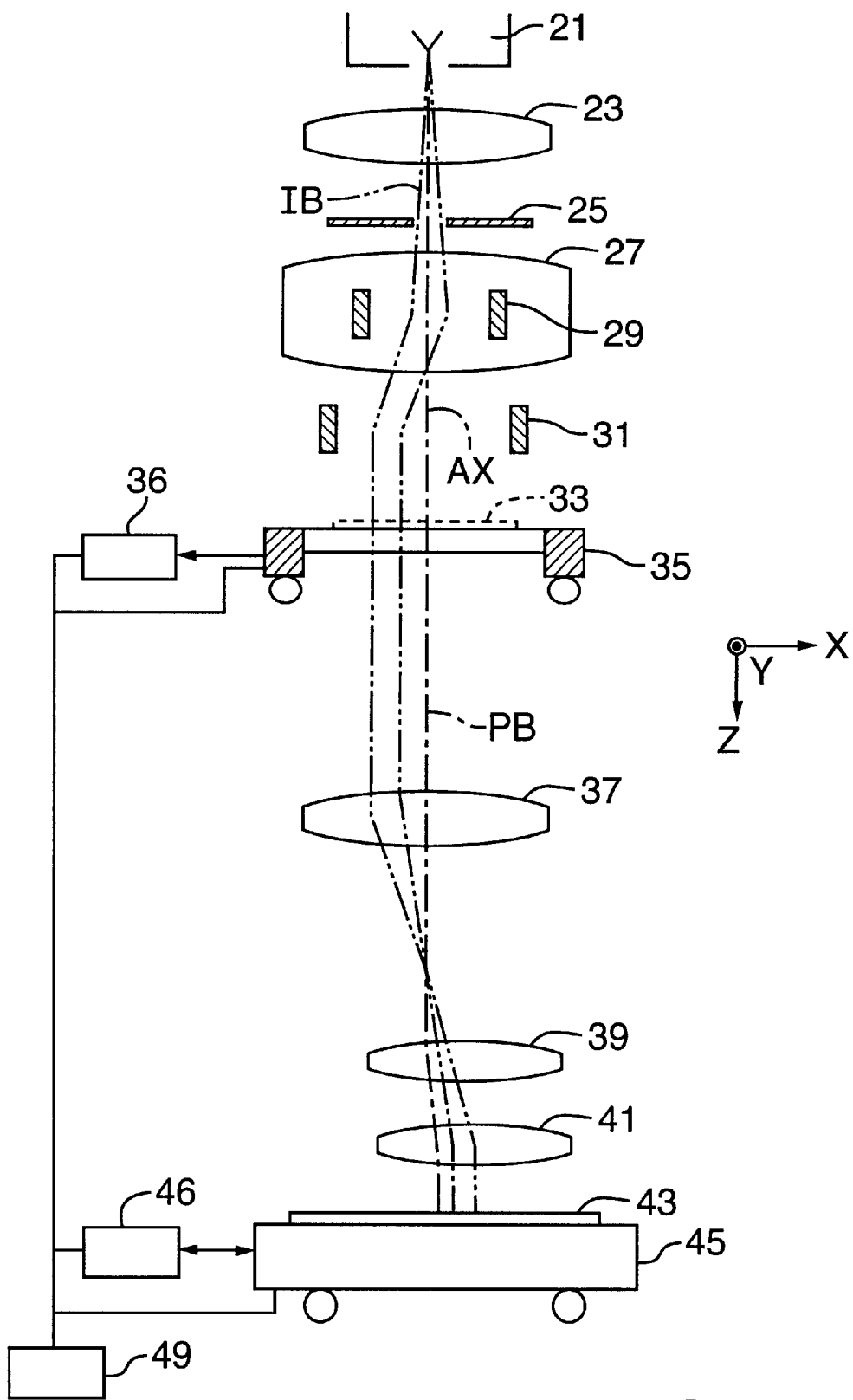
FIG. 3 is an elevational optical schematic diagram of a microlithography apparatus according to the invention, depicting especially certain image-forming relationships in such an apparatus. The apparatus performs reduction divided projection-exposure using an electron beam as a representative charged particle beam.

FIG. 3 shows certain image-forming relationships of this embodiment for performing projection-transfer of a pattern, defined on a divided reticle, onto a wafer or other suitable substrate using an electron beam as a representative charged particle beam.

The most upstream end (top) of the FIG. 3 embodiment is an electron gun 21. The electron gun 21 produces an electron beam that propagates as an "illumination beam" IB in a downstream direction along an optical axis AX. A first illumination lens 23 is disposed downstream of the electron gun 21, and the illumination beam IB passes through the first illumination lens 23 on the optical axis AX to a beam-shaping aperture 25.

The beam-shaping aperture 25 provides the illumination beam IB with a desired transverse profile for illuminating a desired exposure unit on a reticle 33. To form an image of the beam-shaping aperture 25 on the surface of the reticle 33, the illumination beam IB passes through a second illumination lens 27.

Illumination-scanning deflectors 29 and 31 are disposed downstream of the beam-shaping aperture 25, preferably at the same axial position as the second illumination lens. The illumination-scanning deflectors deflect the illumination beam IB to the left and right (in the figure), (i.e., in the X-direction in the figure) as required to individually expose the exposure units on the reticle 33. Such deflection can be stepwise or in a scanning manner.

The second illumination lens 27 irradiates the illumination beam IB, propagating from the beam-shaping aperture 25 and as appropriately deflected by the illumination deflector 29, onto the desired exposure unit on the reticle 33.

The reticle 33 is mounted on a reticle stage 35 that is movable in at least one direction (Y-direction) perpendicular to the optical axis AX. A wafer 43 (as a representative substrate), having an upstream-facing surface coated with a suitable resist for imprinting, is mounted on a wafer stage 45 that is movable in the X and Y directions. As described below, the wafer stage 45 moves the wafer 43 while the reticle stage 35 synchronously moves the reticle 33. Such coordinated motions can be in a scanning manner as each "stripe" of the reticle pattern (see below) is exposed onto the wafer 43. Continuous scanning motions of the stages 35, 45 are made in the Y direction but in opposite directions from each other. After exposure of a stripe is complete, a next stripe on the reticle (and a next corresponding region on the wafer 43) are synchronously moved into position along the optical axis AX for exposure by corresponding stepped motions of the reticle stage 35 and wafer stage 45 in the X direction.

Accurate detection of the positions of the reticle stage 35 and wafer stage 45 is performed by respective measurement systems 36, 46 employing laser interferometers. The measurement systems 36, 46 ensure that, after exposure, the images of the exposure units are accurately joined ("stitched") together on the wafer 43. To ensure such stitching accuracy, appropriate alignments of the stages 35, 45 can be performed as required during exposure of the exposure units.

To load the wafer 43 onto the wafer stage 45, the wafer stage 45 is moved in a direction perpendicular to the optical axis AX.

A controller 49 includes respective stage drivers (not shown) connected to the respective stages 35, 45. The stage drivers position the respective stages based on stage-position data as obtained by the respective measurement systems 36, 46.

As the illumination beam IB passes through the reticle 33, it becomes a "patterned beam" PB. The patterned beam PB passes through a two-stage projection lens 37, 41 and a deflector (not shown in the figure) situated downstream of the reticle 33. The projection lenses 37, 41 cause the patterned beam to form an image of the illuminated exposure unit on the wafer 43. To ensure proper lateral positioning of the image, the deflector (not shown) appropriately deflects the patterned beam PB laterally.

The image of each exposure unit as formed on the surface of the wafer 43 is "demagnified" relative to the size of each corresponding exposure unit on the reticle 33. As each image of a respective exposure unit is formed on the wafer surface, the resist is imprinted with the image, thereby "transferring" the exposure unit onto the wafer. Exposure of all the exposure units of the reticle 33 completes transfer of the pattern onto a corresponding die on the wafer 43.

A focal-point-correction lens 39 is disposed between the projection lenses 37, 41. The focal-point-correction lens 39 corrects the effects of Coulomb interactions and aberrations in each exposure unit as projected onto the wafer 43.

A representative divided configuration of a semiconductor-device pattern, as defined on a reticle, and an exposure sequence of the constituent exposure units using a divided projection-transfer apparatus as described above are described with reference to FIG. 4. The reticle 33 can be either a "stencil" reticle (in which pattern features are defined by corresponding openings or voids in a silicon membrane) or a "membrane" or "scattering" reticle in which pattern features are defined by corresponding spaces situated between scattering bodies on a silicon membrane.

In this representative configuration, the entire chip pattern 60 as formed on the reticle 33 has a rectangular profile. The chip pattern 60 is divided into multiple small regions termed "exposure units" 51 (e.g., subfields). A representative exposure unit 51 is sized $(1 \text{ mm})^2$ on the reticle 33 and $(0.25 \text{ mm})^2$ on the wafer 43 (assuming a demagnification ratio of ¼). On the reticle 33, multiple exposure units 51 are arranged in a lattice array extending in the X and Y directions. A row of exposure units 51 extending in the X direction is termed an "electrical scanning zone" 61. A representative length of one electrical scanning zone 61 on the reticle 20 to 40 mm.

Multiple rows (e.g., tens to hundreds of rows) of electrical scanning zones 61 are arrayed side by side in the Y direction of the chip pattern 60 to form a "stripe" 63. The chip pattern 60 normally contains three to seven stripes.

Arranged peripherally around each exposure unit 51 is a non-patterned region (not shown) having a width of approximately 0.1 mm. The midline of each non-patterned region is typically thickened (in the Z direction) to form a reinforcing strut (thickness about 1 mm). The resulting criss-cross network of struts provides the reticle with substantial structural rigidity. The Z-direction thickness of each exposure unit extending between the struts and defining the respective pattern portion is about, for example, 2 $\mu$m. During transfer-exposure of each exposure unit, the respective non-patterned regions are not transferred to the wafer. Rather, all the exposure units as exposed on the wafer are joined ("stitched") together without intervening non-patterned regions, thereby forming the complete and intact pattern of an entire chip on the wafer. By way of example, if the reticle pattern is for a 4-Gigabit DRAM measuring 27 mm in the X direction and 44 mm in the Y direction, and the demagnification ratio is ¼, then the entire chip pattern on the reticle (including non-patterned regions) measures approximately 120 to 150 mm in the X direction and 150 to 250 mm in the Y direction.

Figure 4:
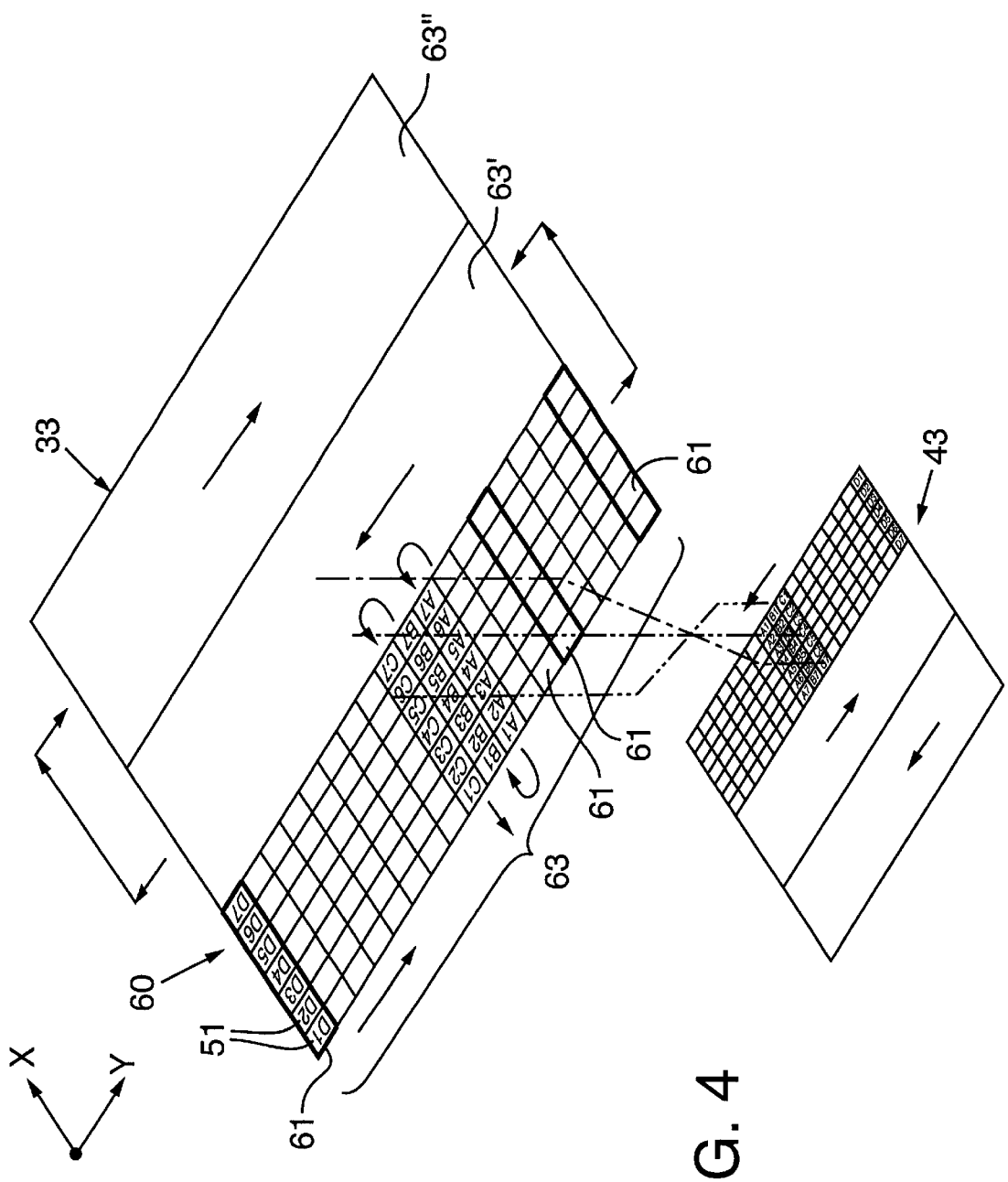
FIG. 4 depicts a representative example of projection-exposure, using the apparatus of FIG. 3, of a reticle (defining a pattern for a semiconductor device) onto a wafer. The reticle is divided into multiple exposure units that are projected onto the wafer. Scanning directions and stage movements are indicated by arrows.

To transfer the chip pattern 60 of FIG. 4, the reticle 33 is illuminated using the illumination beam. The reticle is illuminated stripe-by-stripe in a sequential manner; within each stripe, illumination is performed scanning-zone-by-scanning-zone in a sequential manner; and within each electrical scanning zone, illumination is performed exposure-unit-by-exposure-unit in a sequential manner. Illumination of the exposure units within each electrical scanning zone can be performed by deflecting the illumination beam in the X direction in a step-and-repeat manner or in a continuous scanning manner from exposure unit to exposure unit. As the illumination beam illuminates an exposure unit on the reticle, an image of the beam-shaping aperture is irradiated onto the illuminated exposure unit. The profile of the illumination beam as irradiated onto an exposure unit is typically a square or rectangle (corresponding to the typical profile of the exposure unit and as defined by the beam-shaping aperture) but usually slightly wider (in each of the X and Y directions) than the exposure unit. Particles in the illumination beam passing through the reticle become the "patterned beam" PB that is thus patterned with the features in the exposure unit. The patterned beam PB is demagnified, appropriately deflected, and imaged by the "projection-optical system" (including the two-stage projection lens) onto a corresponding location on the surface of the wafer where the image should be formed.

As each exposure unit is being exposed, dynamic focus adjustments can be performed for each exposure unit. It is noted that, even in instances in which the illumination beam exposes each electrical scanning zone in a continuous scanning manner, the non-patterned regions between each of the exposure units within the electrical scanning zone are not transferred to the wafer. Nevertheless, dynamic focus corrections and the like can be conducted as the illumination beam is being scanned in each electrical scanning zone. Dynamic focus corrections reduce aberrations as required as each exposure unit is exposed.

After each electrical scanning zone is exposed, the reticle stage and wafer stage are synchronously moved in the Y direction to position the subsequent electrical scanning zone on the reticle (and the subsequent corresponding zone on the wafer) for exposure. In FIG. 4, the thick arrows indicate movements of the reticle stage and wafer stage. Because the image as formed on the wafer is reversed by the projection-optical system in this embodiment, the movement directions of the stages are opposite each other. During scanning exposure of each electrical scanning zone, stage movements are continuous. The electrical scanning zone 61 on the reticle moves in the Y direction during exposure synchronously with corresponding motion of the respective zone on the wafer in the Y-direction. Meanwhile, the illumination beam and imaging beam are deflected in the X direction relative to the Y-direction stage movements. Thus, the beams impinge on the correct locations on the reticle and wafer.

After exposure of a stripe 63 is completed, the stages move to position the subsequent stripe 63' for exposure. During this transition, exposure ceases momentarily while the reticle stage and wafer stage move as required in the X-direction to place the stripe 63' and corresponding region on the wafer in the vicinity of the optical axis of the projection-exposure apparatus.

Figure 1:
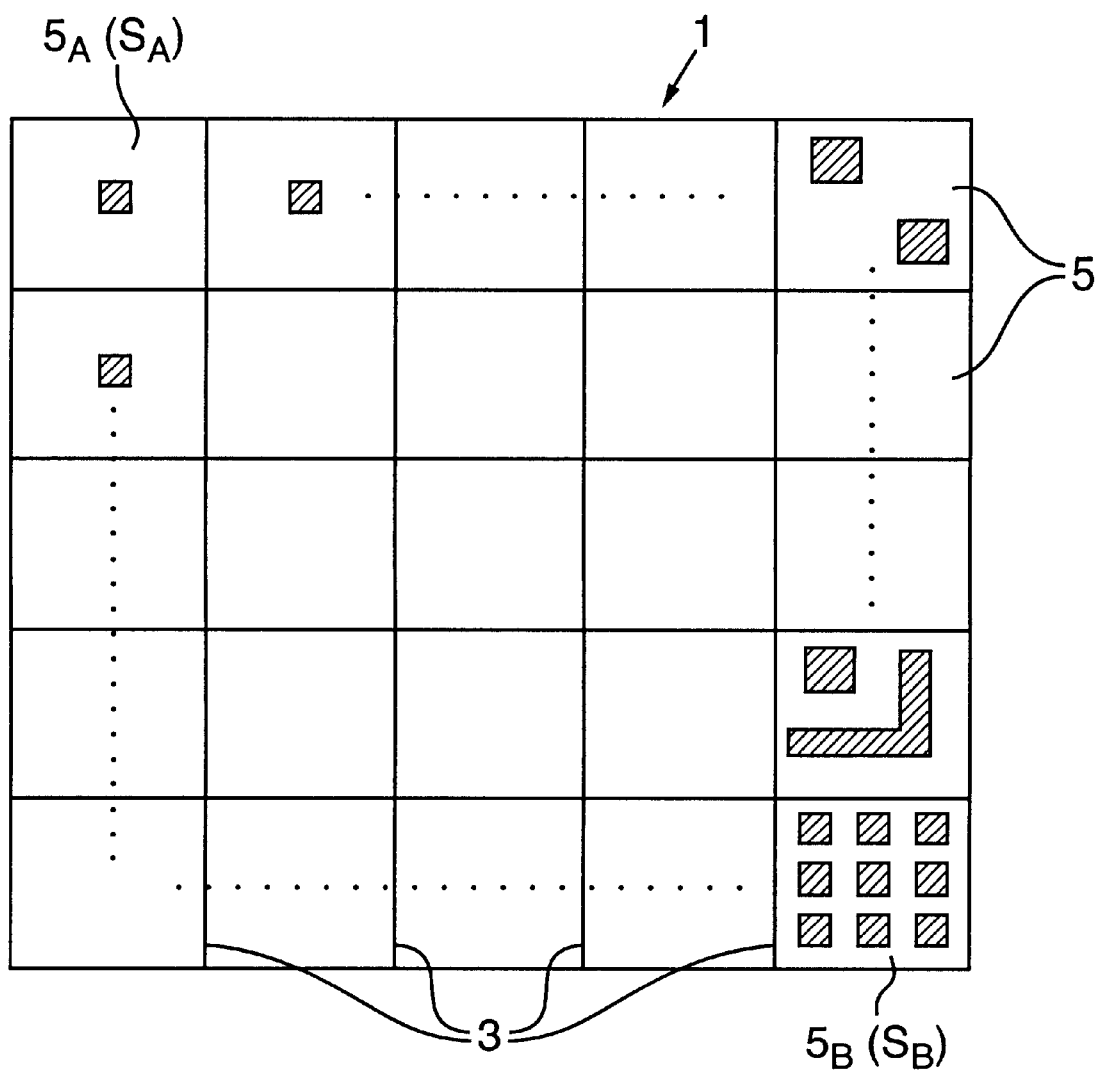
FIG. 1 is a plan view of a representative exposure unit divided into subregions containing different distributions and densities of pattern features.

A plan (top) view of a representative distribution of pattern features in a hypothetical exposure unit 1 is shown in FIG. 1. For analysis purposes, this hypothetical exposure unit 1 is divided by, e.g., four horizontal lines 2 and four vertical lines 3 into twenty-five subregions 5 arranged in a 5×5 matrix. In each subregion, pattern features are indicated by the hatched geometric shapes. The subregion $5_B$ at the lower right corner of the figure has a relatively high feature density and the subregion $5_A$ at the upper left corner of the figure has a relatively low feature density. The relative surface area of features (feature surface area) in each subregion is calculated. Such calculations are desirably performed when the reticle pattern data, as used by a CAD system for designing the actual reticle pattern, is converted into data defining the actual pattern as formed on the reticle. (At such a time, the features in each exposure unit are determined and feature density within subregions of each exposure unit readily can be determined.

For the exposure unit 1, the feature surface area ranges from a minimum $S_A$ at the upper left subregion $5_A$ and a maximum $S_B$ at the lower right subregion $5_B$. The mean feature surface area is determined to be $S_M=(½)(S_A+S_B)$, and a magnitude of focal-point correction is determined so as to correspond to this $S_M$ value. This is repeated for every exposure unit of the reticle. Since these calculations are all performed before commencing exposure using the reticle, throughput is not adversely affected.

Figure 2A:
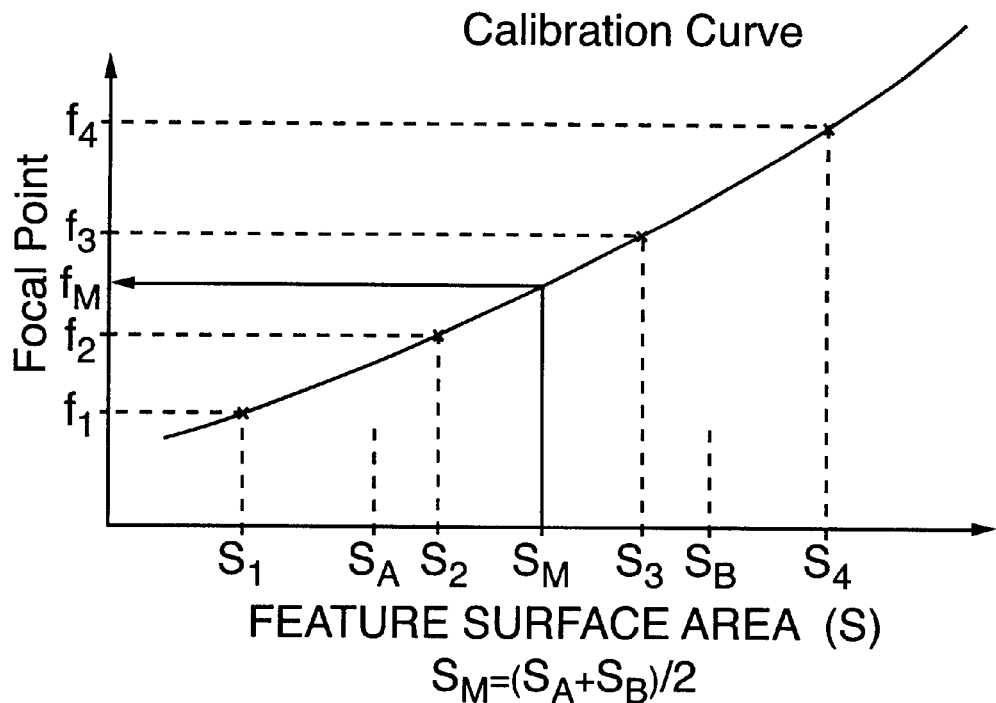
FIG. 2(A) is a graph of a representative calibration curve for focal-point correction of a single exposure unit, according to the invention, based on an average value of feature surface area determined for a single exposure unit.
Figure 2B:
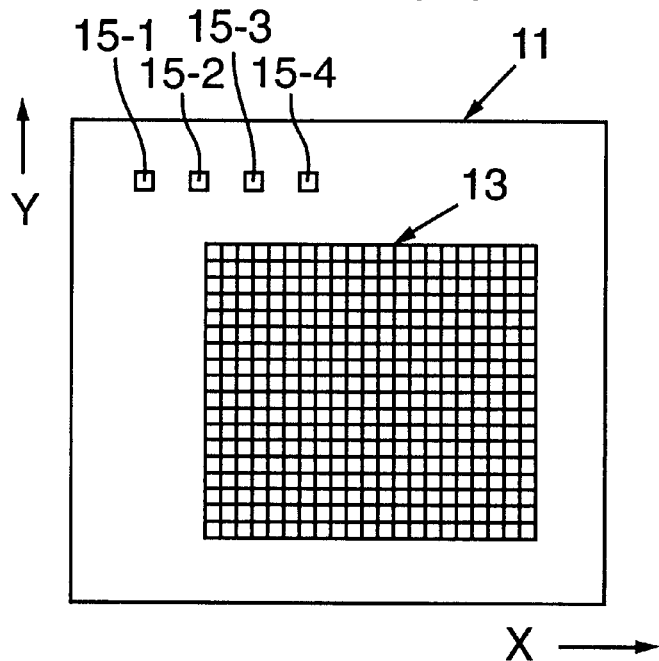
FIG. 2(B) is a plan view of a reticle stage used as a microlithographic apparatus according to the invention. A reticle stage such as this and a graph such as that of FIG. 2(A) are used to determine an optimal correction of focal point based on an average feature area in the subject exposure unit or a subregion thereof.

FIGS. 2(A)–2(B) illustrate certain aspects of a representative procedure, according to the invention, for obtaining an optimum focal-point correction from a mean feature surface area of an exposure unit. In FIG. 2(A), a calibration curve is shown for focal-point correction, and FIG. 2(B) is a plan (top) view of a reticle on a reticle stage.

A reticle 13 defining a pattern for a semiconductor device is mounted on the reticle stage 11 of FIG. 2(B). The reticle stage 11 is movable in the X and Y directions of the figure within a plane perpendicular to the optical axis. In this example, four reference marks 15-1, 15-2, 15-3, 15-4 (four to six are usually sufficient) are arranged along at least one edge of the reticle stage 11 adjacent a corresponding edge of the reticle 13. Each reference mark 15-1 to 15-4 desirably has the same size as an exposure unit of the reticle 13 because actual exposures are performed exposure unit by exposure unit. Each reference mark also has a certain representative pattern of features such as square features each having a predetermined dimension, such as the feature shown in the upper left of FIG. 1. (There are no specific criteria as to which features are used.) The respective feature surface area S of each reference mark is denoted as follows: reference mark 15-1: $S_1$, reference mark 15-2: $S_2$, reference mark 15-3: $S_3$ and reference mark 15-4: $S_4$. Desirably, $S_1$–$S_4$ are different from each other sufficiently to allow plotting of a calibration curve.

As shown in FIG. 2(A), a calibration curve is generated from respective optimal amounts of focal-point correction. I.e., the variables $f_1$–$f_4$ denote respective amounts of focal-point correction as a function of feature density (feature surface areas $S_1$–$S_4$ of the reference marks). As shown in FIG. 2(A), the larger the feature area (which produces a correspondingly larger localized beam current), the larger the required focal-point correction. The variable $f_M$ is the focal-point correction based on the average feature density $S_M$. The calibration curve indicates the focal-point correction required for each reference mark to form an acceptable image on the wafer. The curve also shows the relationship between the imaging beam current and excitation current to be applied to the projection-optical system to obtain an acceptable focal position. The curve also allows for interpolation between actual plotted values. To prepare the curve, respective focal-point corrections $f_1$–$f_4$ corresponding to respective feature surface areas $S_1$–$S_4$ are plotted. A best-fit curve connects the plotted coordinates. A separate curve can be prepared for each exposure unit in which a correction is required due to Coulomb effects.

To determine a focal-point correction that provides optimum focus for a particular exposure unit, reference marks can be arranged on the wafer stage and a beam passing through the reference marks on the reticle stage scans the reference marks on the wafer stage. (The same reference marks can be used for each exposure unit requiring correction.) Backscattered electrons from the reference marks on the wafer stage are detected and processed. (See, Farrow et al., *J. Vac. Sci. Technol. B* 10(6):2780–2783, November/December, 1992, incorporated herein by reference.) Alternatively, an actual exposed pattern can be inspected to provide feedback data.

The mean value $S_M$ of the minimum feature surface area $S_A$ and the maximum feature surface area $S_B$ of the subregions in each exposure unit of the pattern to be transferred is determined. Then, the mean amount of focal-point correction $f_M$ is determined, corresponding to the mean feature surface area $S_M$ on the calibration curve of FIG. 2(A). (Each exposure unit typically has a respective value of $f_M$.) Data concerning this focal-point correction amount is routed to the focal-point correction lens 39 of FIG. 3. The electrical energy supplied to the focal-point correction lens is changed as required to change the focusing of the projected exposure unit on the wafer.

Therefore, in a "divided" projection-transfer apparatus and method employing a charged particle (e.g., electron beam), appropriate focal-point corrections can be made as required for respective deviations in the feature distribution within an exposure unit of the pattern. Also, calibrations of a focal-point correction lens are simplified.

Figure 5:
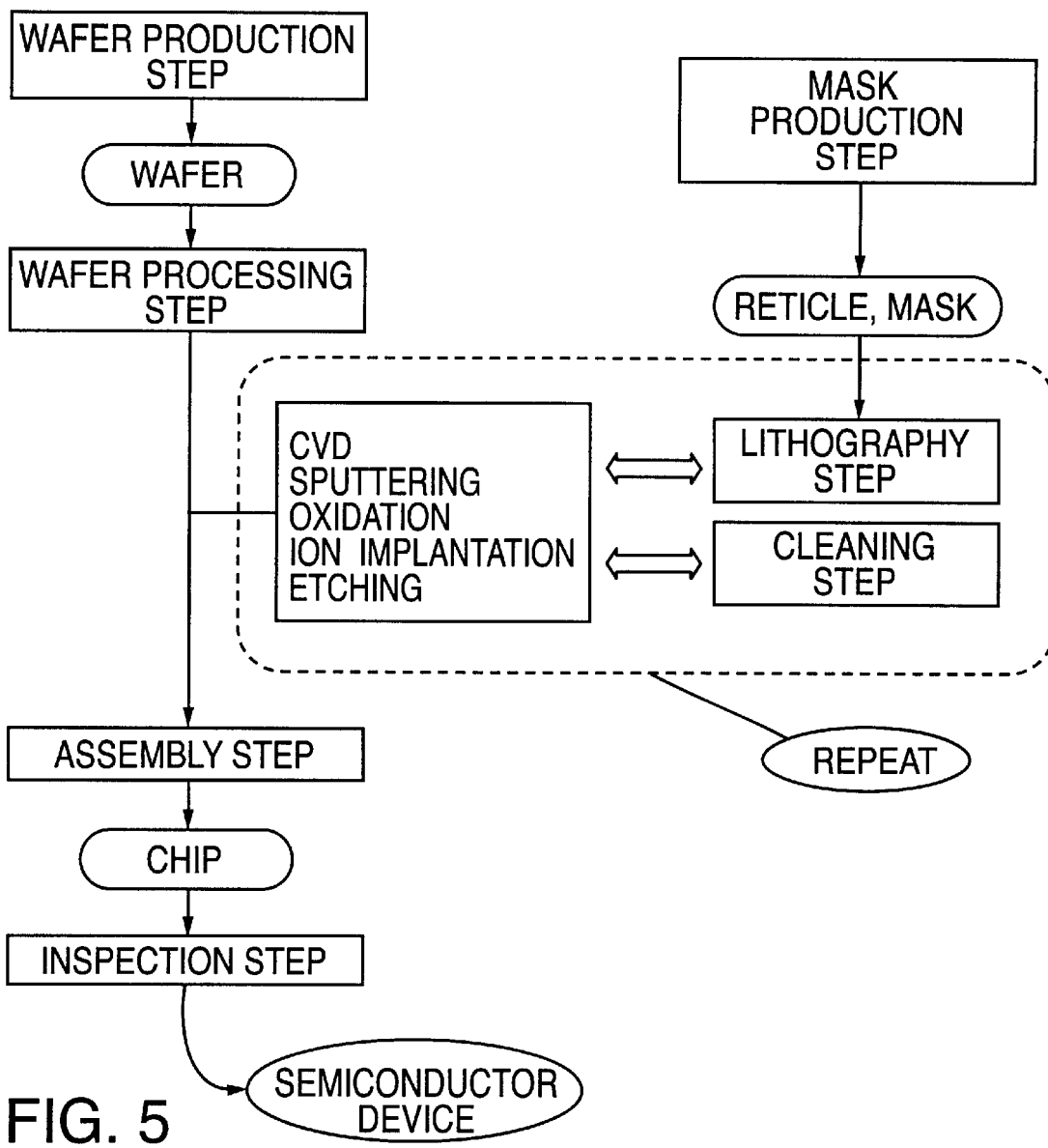
FIG. 5 is a process flowchart for manufacturing a semiconductor device, wherein the process includes a microlithography method according to the invention.

FIG. 5 is a flowchart of an exemplary semiconductor fabrication method to which apparatus and methods according to the invention can be readily applied. The fabrication method generally comprises the main steps of wafer production (wafer preparation), reticle production (reticle preparation), wafer processing, device assembly, and inspection. Each step usually comprises several sub-steps.

Among the main steps, wafer processing is key to achieving the smallest feature sizes (critical dimensions) and best inter-layer registration. In the wafer-processing step, multiple circuit patterns are successively layered atop one another on the wafer, wherein the formation of each layer typically involves multiple sub-steps. Usually, many operative semiconductor devices are produced on each wafer.

Typical wafer-processing steps include: (1) thin-film formation involving formation of a dielectric layer for electrical insulation or a metal layer for connecting wires; (2) microlithography to form a resist pattern for selective processing of the thin film or the substrate itself; (3) etching or analogous step to etch the thin film or substrate according to the resist pattern, or doping as required to implant ions or impurities into the thin film or substrate according to the resist pattern; (4) resist stripping to remove the resist from the wafer; and (5) chip inspection. Wafer processing is repeated as required (typically many times) to fabricate the desired semiconductor chips on the wafer.

Figure 6:
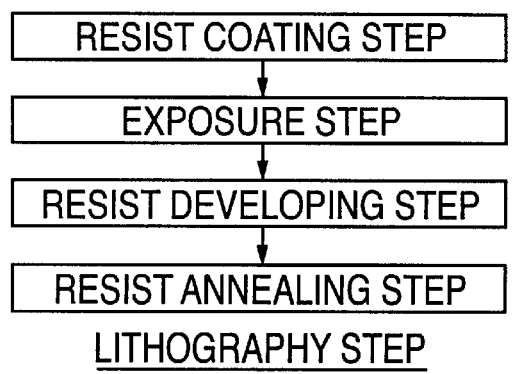
FIG. 6 is a process flowchart for performing a microlithography method that includes a projection-exposure method according to the invention.

FIG. 6 provides a flow chart of typical steps performed in microlithography, which is a principal step in wafer processing. The microlithography step typically includes: (1) resist-coating step, wherein a suitable resist is coated on the wafer substrate (which can include a circuit element formed in a previous wafer-processing step; (2) exposure step, to expose the resist with the desired pattern; (3) development step, to develop the exposed resist; and (4) annealing step, to enhance the durability of the resist pattern.

Methods and apparatus according to the invention can be applied to a semiconductor fabrication process, as summarized above, to provide substantially improved accuracy or resolution.

Whereas the invention has been described in connection with a representative embodiment, it will be apparent that the invention is not limited to that embodiment. On the contrary, the invention is intended to encompass all alternatives, modifications, and equivalents as may be included within the spirit and scope of the invention as defined by the appended claims.

What is claimed is:

1. In a charged-particle-beam (CPB) microlithography projection-exposure method in which a pattern, defined by a reticle, is projection-transferred onto a sensitive substrate using a CPB projection-optical system, the reticle pattern being divided into multiple exposure units that are individually and sequentially transferred to corresponding respective locations on the substrate where images of the exposure units are stitched together to form a complete pattern on the substrate, an improvement comprising:

providing a focal-point-correcting lens in the CPB projection-optical system, the focal-point-correcting lens being selectively energizable as required to change a focal point of an image of an exposure unit being exposed onto the sensitive substrate using the CPB projection-optical system:

dividing an exposure unit into multiple subregions;

calculating a respective feature surface area within each subregion so as to determine a minimal feature surface area greater than zero and a maximal feature surface area for the exposure unit;

calculating, from the minimal and maximal feature surface areas for the subregions of the exposure unit, an average feature surface area for the exposure unit; and energizing the focal-point-correcting lens according to the calculated average feature surface area so as to adjust a focal point of the CPB projection-optical system.

2. The method of claim 1, further comprising the steps of:

mounting the reticle on a reticle stage;

providing a reference mark on the reticle stage, the reference mark being configured for calibrating the feature surface area within each of the subregions of the exposure unit and an amount of focal-point correction required for the exposure unit; and forming an image of the reference mark on an exposure surface so as to obtain a calibration of the amount of focal-point correction.

3. In an apparatus for performing charged-particle-beam (CPB) microlithography projection-exposure of a pattern, defined by a reticle, onto a sensitive substrate using a CPB projection-optical system, the reticle pattern being divided into multiple exposure units that are individually and sequentially transferred to corresponding respective locations on the substrate where images of the exposure units are stitched together to form a complete pattern on the substrate, an improvement comprising:

(a) a reticle stage;

(b) a focal-point-correction lens situated and configured to be selectively energizable so as to correct an image-forming condition for each exposure unit; and (c) a reference mark disposed on the reticle stage, the reference mark being configured for calibrating a feature surface area within an exposure unit and for determining an amount of focal-point correction to impart to a projected image of the exposure unit, the reference mark being situated to form an image on an exposure surface so as to allow calibration of the amount of focal-point correction.

4. A semiconductor-fabrication process, comprising the steps of:
(a) preparing a wafer;
(b) processing the wafer; and
(c) assembling devices formed on the wafer during steps (a) and (b), wherein step (b) comprises a method for performing projection microlithography as recited in claim 1.

5. A semiconductor-fabrication process, comprising the steps of:
(a) preparing a wafer;
(b) processing the wafer; and
(c) assembling devices formed on the wafer during steps (a) and (b), wherein step (b) comprises the steps of (i) applying a resist to the wafer; (ii) exposing the resist; (iii) developing the resist; and (iv) annealing the resist; and step (ii) comprises providing a charged-particle-beam projection-exposure apparatus as recited in claim 3; and using the charged-particle-beam projection-exposure apparatus to expose the resist with the pattern defined on the reticle.

6. A semiconductor device produced by the method of claim 5.

* * * * *

UNITED STATES PATENT AND TRADEMARK OFFICE
CERTIFICATE OF CORRECTION

PATENT NO.   : 6,277,531 B1  
DATED        : August 21, 2001  
INVENTOR(S)  : Morita It is certified that error appears in the above-identified patent and that said Letters Patent is hereby corrected as shown below:

<u>Column 8,</u>  
Line 7, change "determined." to -- determined.) --.  
Line 10, change "subregion $5_B$" to -- subregion $5_B$. --.

<u>Column 9,</u>  
Line 60, change "step;" to -- step;) --.

<u>Column 10,</u>  
Line 24, change "system:" to -- system; --.

Signed and Sealed this

Fourth Day of June, 2002

*Attest:*

JAMES E. ROGAN  
*Attesting Officer*   *Director of the United States Patent and Trademark Office*